United States Patent [19]

Weng

[11] Patent Number: 4,881,075
[45] Date of Patent: Nov. 14, 1989

[54] METHOD AND APPARATUS FOR ADAPTIVE DATA COMPRESSION

[75] Inventor: Lih-Jyh Weng, Lexington, Mass.

[73] Assignee: Digital Equipment Corporation, Maynard, Mass.

[21] Appl. No.: 108,892

[22] Filed: Oct. 15, 1987

[51] Int. Cl.⁴ .......................................... H03M 7/30
[52] U.S. Cl. ...................................... 341/87; 341/51; 341/106
[58] Field of Search ............... 340/347 DD; 235/310, 235/311; 364/200, 900; 358/260, 261; 382/56; 341/50, 51, 67, 87, 95, 106, 107

[56] References Cited

U.S. PATENT DOCUMENTS

| | | | |
|---|---|---|---|
| 4,099,257 | 7/1978 | Arnold et al. | 340/347 DD |
| 4,355,306 | 10/1982 | Mitchell | 340/347 DD |
| 4,464,650 | 8/1984 | Eastman et al. | 340/347 DD |
| 4,558,302 | 12/1985 | Welch | 235/310 |

Primary Examiner—William M. Shoop, Jr.
Assistant Examiner—Brian Young
Attorney, Agent, or Firm—Finnegan, Henderson, Farabow, Garrett and Dunner

[57] ABSTRACT

Data compression/decompression apparatus and methods are provided which exhibit significant data compression improvement over prior art methods and apparatus. This is achieved by providing an adaptive characteristic in which a pair of data compression/decompression translation tables are constructed based on the data which is to be compressed or decompressed. One table is used to compress or decompress while the other is being rebuilt, thus reflecting the characteristics of the most recent input data.

28 Claims, 13 Drawing Sheets

COMPRESSION

DECOMPRESSION

METHOD AND APPARATUS FOR ADAPTIVE DATA COMPRESSION

BACKGROUND OF THE INVENTION

The invention relates generally to data processing and, more particularly, to methods and apparatus for representing input data in a form requiring fewer bits than the original data, with no loss of information.

The storage and transmission of information is becoming increasingly important in modern economic systems. Such information often consists of material such as text which contains a large amount of redundancy. Such redundancy can be reduced by the process of data compression to increase data density while retaining all of the original information. Compressed data thus has the same information content as the original non-compressed data but can be stored in smaller amounts of memory and can be transmitted over a communication channel in less time. This provides significant reductions in the cost of data storage and transmission. The compression data is then decompressed to obtain a replica of the original non-compressed data.

Existing techniques provide useful data compression for various applications. For example, the prior art technique of Huffman coding converts data of uniform increments into code values of variable length. More sophisticated techniques have been developed to overcome various problems with Huffman-type coding systems, such as those described in a paper entitled "A Universal Algorithm For Sequential Data Compression" by Lempel and Ziv, IEEE Transactions on Information Theory, Volume IT-23, No. 3, May 1977. The system described in this paper, hereinafter referred to as the "LZ" system, provides fixed length code values which are chosen to represent varying numbers of input data symbols, such as text characters. The objective of the LZ system is to represent as many input data symbols as possible by a single code value.

The LZ system uses a translation table to assign code values for input data symbol strings and to derive decompressed data symbol strings from an input of code values. The table is generated simultaneously with the compression and decompression procedures from the input data symbols and input code values, respectively, and is continuously modified along with the stream of input symbols. The LZ system is thus said to be "adaptive", and provides increasingly good compression characteristics as the translation table is built and modified.

The LZ procedure can produce efficient data compression, but is difficult to implement in some computer hardware configurations. A variation of the LZ system is described in U.S. Pat. No. 4,558,302 to Welch and in the article "A Technique For High Performance Data Compression" by Terry A. Welch, Computer, June 1984. This system, which will be referred to as the LZW system, is more suitable for implementation in computer hardware. However, the LZW system builds a fixed translation table and is thus not as adaptive as the LZ system. Under certain conditions, the LZW system can result in less efficient data compression.

It is therefore desirable to provide a method and apparatus for data compression which is readily implemented in computer hardware, and which exhibits highly adaptive characteristics to achieve greater data compression.

SUMMARY OF THE INVENTION

The present invention provides a data compression method and apparatus exhibiting improved efficiency. This is achieved by providing an adaptive characteristic in which a pair of data compression/decompression translation tables are constructed based on the data which is to be compressed or decompressed. One table is used to compress or decompress while the other is being rebuilt to reflect the statistical characteristics of the most recent input data.

In one aspect, the invention provides a method for compressing input data symbol signals to generate a stream of code value signals comprising a compressed form of the input data symbol signals. The method comprises a first step of loading a first translation table in memory with data symbol signals, a second step of loading a second translation table in memory with input data symbol signals according to a predetermined table construction procedure, a third step of generating a stream of the code value signals representative of input data symbols according to a predetermined data compression procedure using the contents of the first table, a fourth step of loading the first table with the input data symbol signals according to the predetermined table construction procedure, a fifth step of generating a stream of the code value signals representative of input data symbols according to the predetermined data compression procedure using the contents of the second table, and a sixth step of repeatedly performing the second through fifth steps.

In another aspect, the invention provides a method of generating a stream of data symbol signals from a stream of code value signals representing compressed data symbol signals. The method comprises a first step of loading data symbol signals in a first translation table in memory, a second step of processing the code value signals using the first table according to a predetermined decompression procedure to generate a stream of data symbol signals, a third step of loading data symbol signals in a second translation table in memory according to a predetermined table construction procedure, a fourth step of processing the code value signals using the second table according to the predetermined decompression procedure to generate a stream of data symbol signals, and a fifth step of loading the first table with data symbol signals according to the predetermined table construction procedure, and a sixth step of sequentially repeating the second through fifth steps.

In yet another aspect, the invention provides a method of generating an output stream of decompressed data symbol signals from an input stream of code value signals representing compressed data symbol signals. This method comprises a first step of preloading a first translation table in memory with a predetermined set of data symbol signals, a second step of processing the code value signals using the data symbols stored in the first table according to a predetermined decompression procedure to obtain a stream of decompressed data symbol signals, a third step of loading a second translation table in memory with the decompressed data symbol signals obtained in the second step according to a predetermined table construction procedure, a fourth step of repeatedly performing the second and third steps until the second table is full, a fifth step of processing the code value signals using data symbol signals stored in the second table according to the predetermined decompression procedure to supply decompressed data symbol signals to the output stream, a sixth step of loading the first table with the decompressed data symbol signals obtained in the fifth step according to the predetermined table construction procedure, a seventh step of repeatedly performing the fifth and sixth steps until the first table is full, and an eighth step of repeatedly performing the second through seventh steps.

The accompanying drawings, which are incorporated in and constitute a part of this invention, illustrate one embodiment of the invention, and, together with the description, serve to explain the principles of the invention.

DESCRIPTION OF THE PREFERRED EMBODIMENTS

Figure 1:
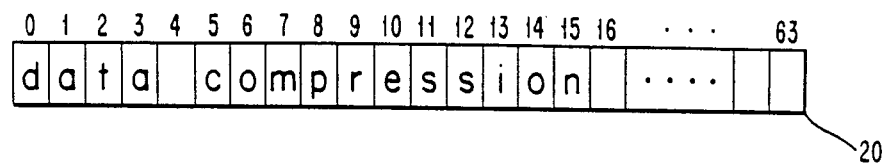
FIG. 1 shows an input buffer used in a preferred embodiment of the present invention.

Referring now to the figures, like reference characters refer to corresponding elements.

The present invention provides methods and apparatus for data compression and decompression which built translation tables in memory and use these translation tables to generate code value signals representative of strings of input data symbol signals. The code value signals can then be stored or transmitted as compressed data completely representative of the original input data.

A brief explanation of this table building process will be described with respect to FIGS. 1 and 2. FIG. 1 shows an input buffer 20 having a capacity to store sixty-four data symbol signals, such as eight-bit ASCII text characters. Buffer 20 in FIG. 1 is shown to contain, for example, input data symbol signals consisting of the ASCII characters "data compression."

Figure 2:
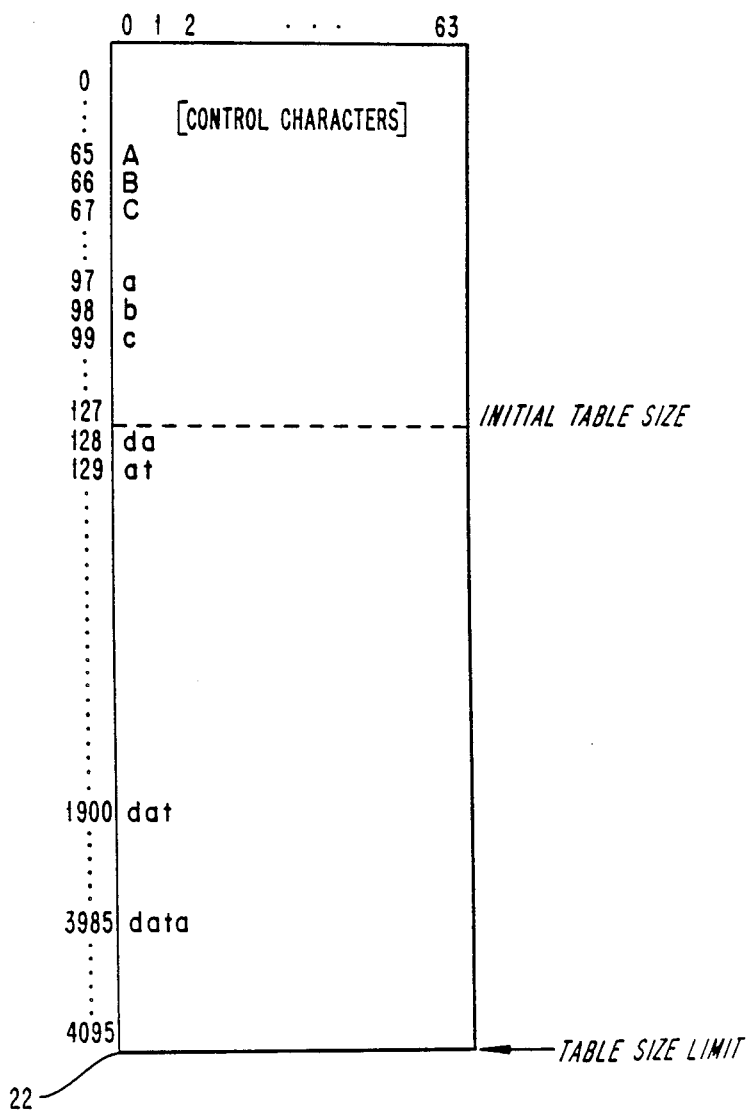
FIG. 2 shows a translation table used in a preferred embodiment of the present invention.

FIG. 2 shows a translation table 22 implemented in computer memory which consists of a maximum of 4096 entries, with each entry capable of storing up to sixty-four ASCII charcters. Table 22 in FIG. 2 is shown to initially contain only 128 entries each consisting of only one character of the standard ASCII character set. Along the left of table 22 in FIG. 2 is a series of index values each associated with one entry in table 22. The index values can be represented by the memory address of each entry.

The first step in the table building procedure consists of analyzing the contents of buffer 20 to determine the longest character string present in buffer 20 which is also present in translation table 22. Initially, since translation table 22 consists of entries having only single ASCII characters, the longest matched character string will be only one character long. Thus, the initial matched character string would be the single character "d" contained in the table entry specified by table index value 100. A new table entry is then constructed consisting of data symbol "d" and the next data symbol present in buffer 20, namely, the character "a". This is indicated in FIG. 2 as the table entry identified by index 128.

As each table entry is added, the contents of buffer 22 are shifted to the left and new input data symbols to be compressed are added from the right. As additional data symbol signals pass through buffer 20, additional entries are added to table 22, consisting of two character entries. three character entries, etc., up to sixty-four character entries. If the text contained in the present patent were being compressed, the words "data compression" would appear quite often. Accordingly, the character strings present in the word "data" would eventually be added, two at a time, three at a time, and four at a time such that a string containing all four characters of the word "data" would eventually be added to the table. This is shown in FIG. 2 wherein the first two-character entry of table 22 are the characters "da" present in the table entry specified by index value 128. A table entry specified, for example, by index value 1900 contains the three-character entry "dat" and the table entry identified by index value 3985 contains the four-character string "data". In a manner to be completely described below, table 22 is constructed to contain 4096 entries consisting of character strings present in the text being compressed.

After a translation table is built, the data compression procedure consists of analyzing the input data symbols and finding the longest string of characters present in buffer 20 which is also present in table 22. If the input characters shown in FIG. 1 were compressed using table 22 of FIG. 2, the longest character string present in both buffer 20 and table 22 is the string "data". It is determined that this character string is present as the table entry identified by the index value of 3985. The index value of 3985 is a twelve-bit value which becomes the code value signal. Accordingly, a code value signal of 3985 is produced which consists of a twelve-bit piece of data completely representative of the original four ASCII characters "data" which originally required thirty two bits to express.

It can be appreciated that longer character strings, up to sixth four characters in the example shown in FIGS. 1 and 2, can be represented by as single twelve-bit piece of data. Moreover, it data symbols to be compressed are taken from the same type of text as was used to construct the translation table, it is likely that many strings of input data symbols will appear in the table, allowing many multiple character strings to be represented by a twelve-bit code value symbol, resulting in high compression efficiency. On the other hand, if different types of text are present in the table than are present in the data to be compressed, each ten-bit code value signal is likely to represent fewer characters. For example, if a text file consisting of a financial report were used to construct a translation table, the string "data" would not likely appear in such translation table. Thus, the code value signals representing compressed text of an article on data compression which were constructed from the financial report table would be more likely to consist of code value signals representing two and three character strings, such as the string "the", which would appear in both types of text.

Prior art procedures have utilized either adaptive techniques where the translation table is constantly changing or non-adaptive techniques where the translation table is fixed. The former have the advantage of exhibiting very favorable data compression characteristics, while the latter are more easily implemented in computer hardware. The present invention combines the advantages of both types of prior art techniques by the use of a plurality of translation tables, using one translation table to either compress or decompress data while the other translation table is being built. When the second translation table has been completely built, using current input data symbol signals, the procedure utilizes the second translation table to compress and decompress data while the original translation table is being rebuilt using the most current input data. In this manner, the advantages of adaptive techniques are provided in a manner amenable to implementation in computer hardware.

Figure 3:
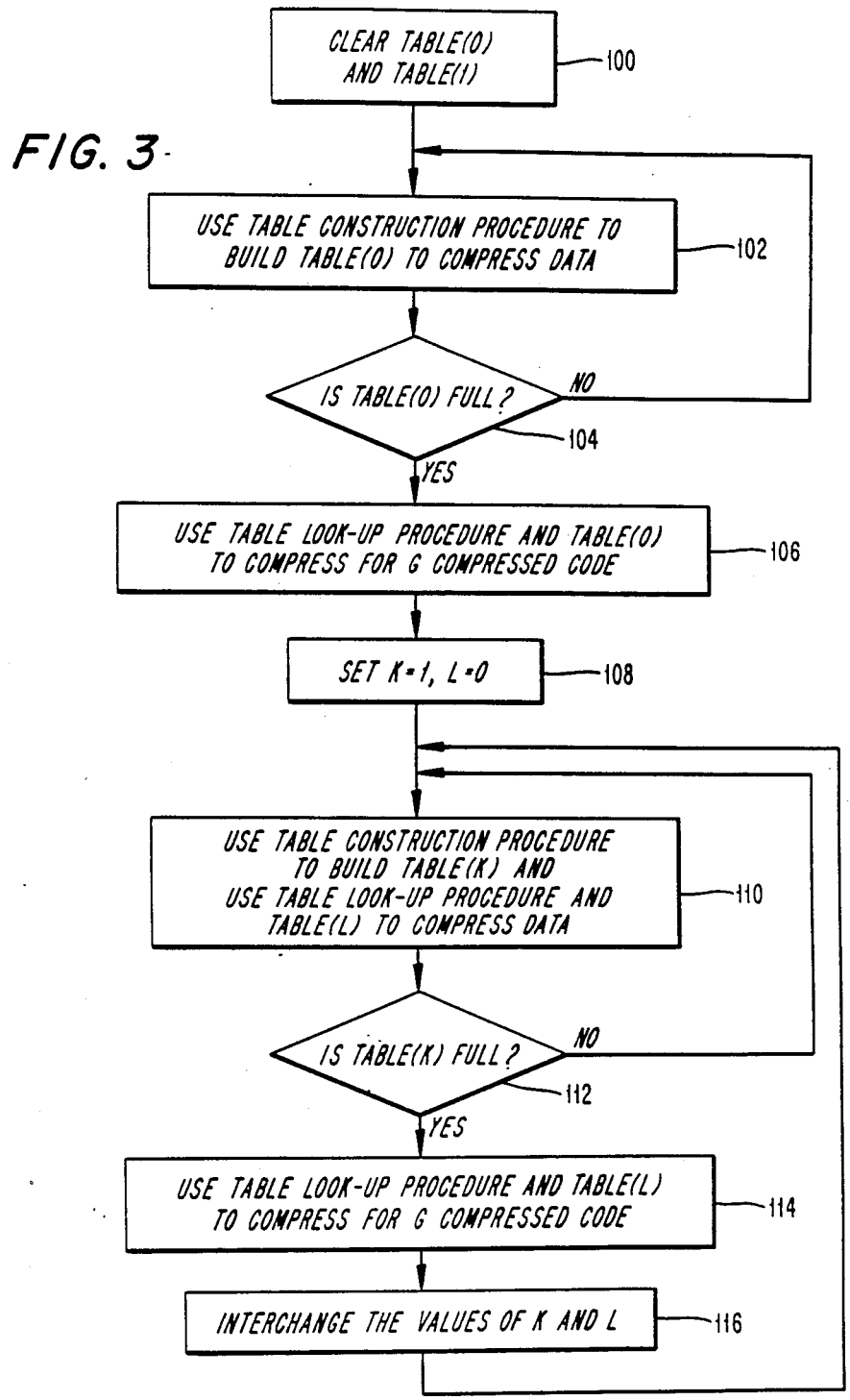
FIG. 3 is a logic flow chart of a data compression procedure constituting a preferred embodiment of the present invention.

Referring now to FIG. 3, there is shown a logic flow chart of a data compression procedure which constitutes a preferred embodiment of this invention. In the embodiment illustrated in FIG. 3, a pair of translation tables, table(0) and table(1), are employed. At the beginning, table (0) is being built while it is simultaneously being used for data compression. After table(0) has been completed, one of the tables is used to compress data while the other is being rebuilt.

At block 100, both tables are cleared. At block 102, a table construction procedure (to be described below in greater detail) is employed to build table(0). At block 104 it is determined whether table(0) has been completely constructed. If not, block 102 is repeated until such time as table(0) if fully constructed.

At block 106, a table look-up procedure (to be described below in greater detail) is employed, using input data symbol signals from table(0) to generate a number G of code value signals. The number G will be referred to as a "gap". The size of the gap, i.e., the number of code value signals generated between the switching of tables, has an effect on the data compression efficiency as will be described below in greater detail. The purpose of the gap is to provide design flexibility to select the frequency with which tables will be switched. Also, a gap eases the problem of syncronizing data storage when tables are switched.

At block 108, a pair of flags K and L are initialized to 1 and 0, respectively, to be utilized in switching back and forth between table(1) and table(0). At block 110, the table construction procedure is employed to build table(K), which on the first pass through the procedure is table(1). Simultaneously, the table look-up procedure is employed, using data symbol signals stored in table(1) to compress data. On the first pass through the procedure, the table look-up procedure will use the data symbol signals stored in table(0) at block 102. Block 110 is repeatedly executed until table(k) (initially table(1)) is full, as determined at block 112.

At block 114, the table look-up procedure is employed, using data symbol signals stored in table(L) (initially table(0)) to generate a gap of G of code value signals. At block 116, the values of flags K and L are interchanged and the procedure returns to block 110. The first translation table is then constructed simultaneously with the production of code value signals from the second translation table.

In this manner, the statistical characteristics of input data symbol signals which are currently being compressed are employed to build the translation table. This will result in more efficient data compression than prior art procedures which do not employ adaptive characteristics to utilize the most current statistical characteristics of the input data in generating code value signals.

Figure 4:
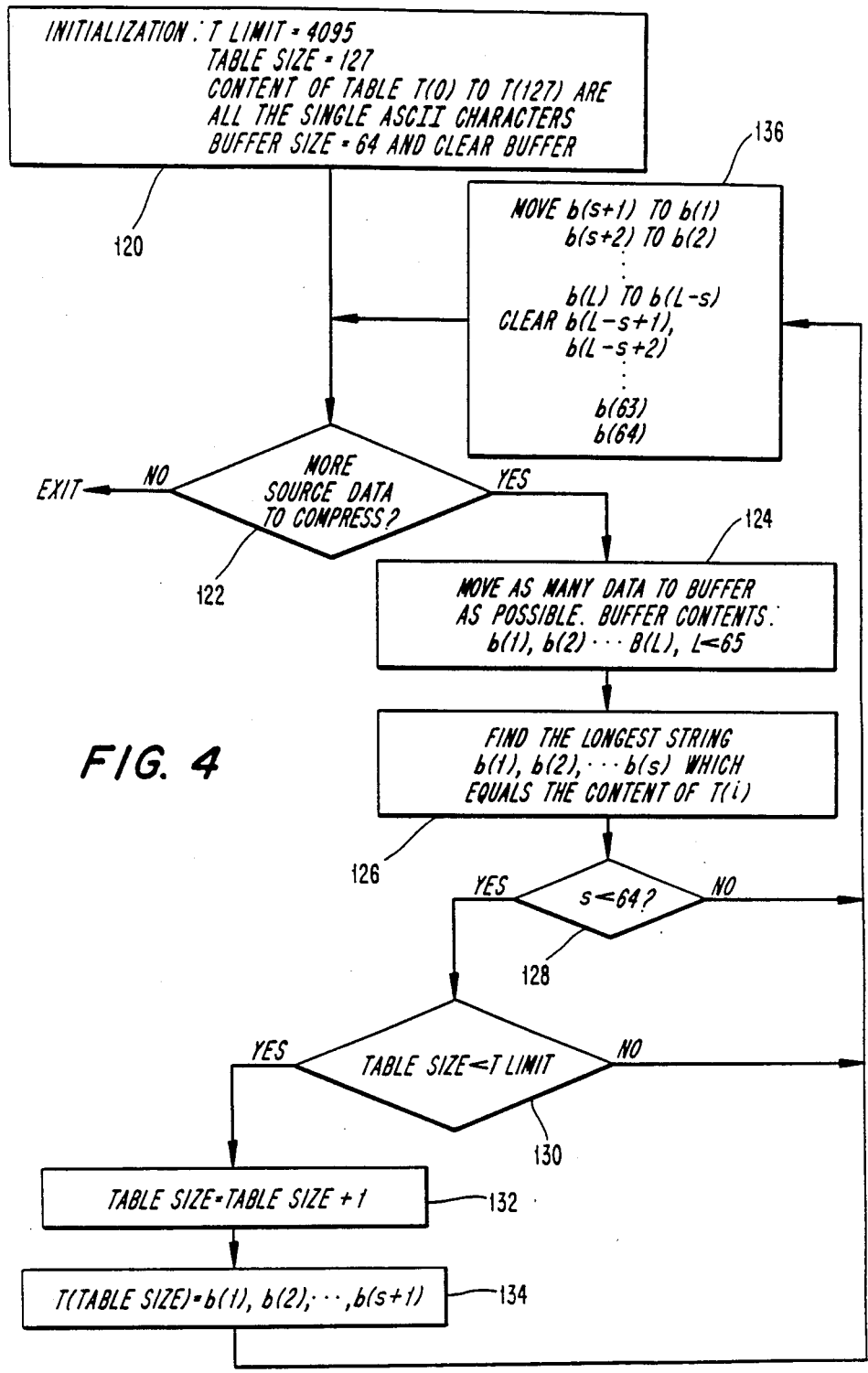
FIG. 4 is a logic flow chart of a table construction procedure used in the procedure of FIG. 3.

FIG. 4 shows a table construction procedure employed in the data compression procedure of FIG. 3. Initialization is performed at block 120 to set a translation table size limit of, for example, 4095. The translation table corresponds to table 22 in FIG. 2. An initial table size of 127 is established, and a set of known data symbol characters such as, for example, the set of single ASCII characters, are stored in the translation table. An input buffer size of, for example, 64 is established and the buffer is cleared. The buffer corresponds to buffer 20 of FIG. 1.

At block 122, it is determined if there are more input data symbol signals to compress. If not, the procedure exits. If there are more data symbol signals to compress, buffer 20 is filled with input data symbol signals at block 124. At block 126, a determination is made of the longest character string present in buffer 20 which is also present in translation table 22. If the number of characters in the matched string is larger than the buffer, as determined at block 128, this implies that table 22 already contains an entry having the sixty-four-character string which is now present in buffer 20. If the matched character string is smaller than 64, that is, smaller than the buffer size, a determination is made at block 130 if the current table size is less than the table size limit. If not, the table is considered to be full. If the current table size is less than the table size limit, the current table size is incremented at block 132 and a new table entry added to the bottom of the table at block 134 consisting of the matched character string concatenated with the next character present in buffer 20.

After the table size checks and adjustments of blocks 130 and 134, buffer 20 is refilled with new input characters, as indicated at block 136. The procedure then returns to block 122.

Figure 5:
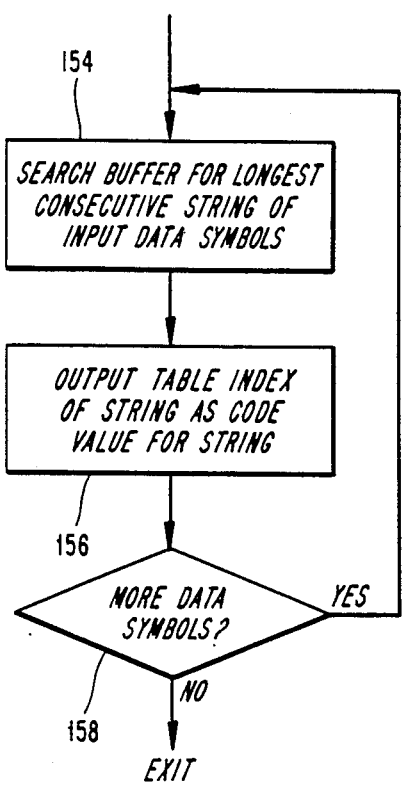
FIG. 5 is a logic flow chart of a compression table lookup procedure used in the procedure of FIG. 3.

FIG. 5 shows a compression table lookup procedure employed in the data compression procedure of FIG. 4. At block 154, buffer 20 is searched for the longest consecutive string of input data symbols which are also present in table 22. At block 156, the index of the entry in table 22 containing the longest string is output as a code value signal for the string. At block 158, it is determined if there are more data symbols present to be compressed. If so, blocks 154 and 156 are repeatedly executed. If not, the procedure exits.

Figure 6:
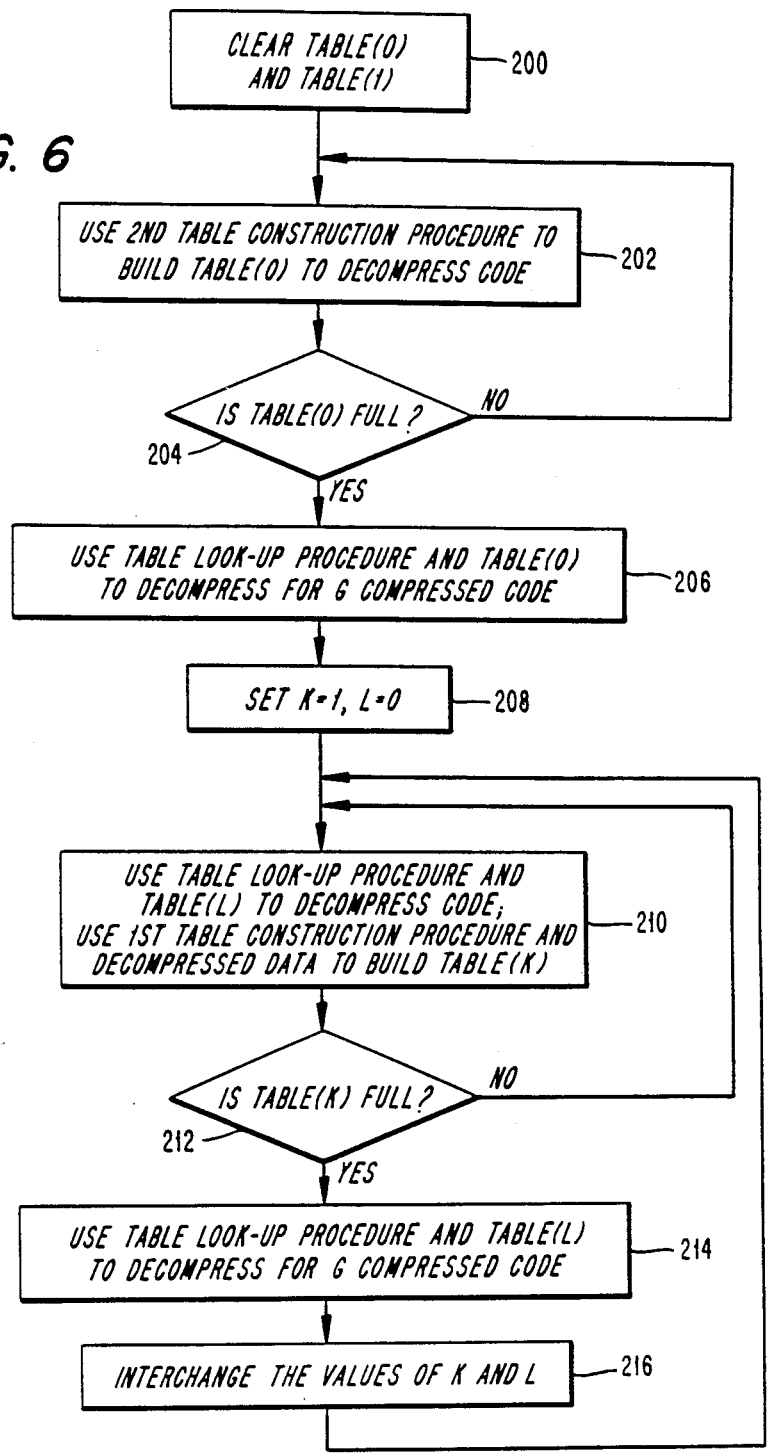
FIG. 6 is a logic flow chart of a data decompression procedure which constitutes another preferred embodiment of the invention.

FIG. 6 shows a data compression procedure constituting a preferred embodiment of the present invention which corresponds to the data compression procedure shown in FIG. 3. The procedure shown in FIG. 6 also employs a pair of translation tables. While the contents of one table are being used to decompress scode value signals, the other table is being built using the most current data input.

In block 200, both tables are cleared. At block 202, a second table construction procedure, to be described below in greater detail, is employed to build table(0). Block 202 is repeatedly executed until table(0) is full, as determined at block 204.

At block 206, a decompression table lookup procedure, to be described below in greater detail, is employed, using data symbols stored in table(0), to decompress code value signals to produce a gap G of data symbol signals. The gap G, in the manner similar to that described above, is for the purpose of design flexibility and improved synchronization.

At block 208, flags K and L are initialized for use in switching between the two translation tables.

At block 210, the decompression table lookup procedure is employed, using the contents of table(L) (which on the initial pass through the procedure of FIG. 6 constitutes the use of table(0)) to decompress code value signals to produce data symbol signals. Simultaneously, the table construction procedure, shown in FIG. 4, is employed using decompressed data just obtained to build table(K), which on the initial pass of the procedure of FIG. 6 is table(1).

Block 210 is repeatedly executed until table(K) is full, as determined at block 212. At that time, the decompression table lookup procedure is employed, using table(L), which on the initial pass is table(0), to decompress a gap G of code value signals. At block 216, the values of K and L are interchanged and blocks 210-214 repeated, to alternatingly build one data translation table and decompress code value signals with the other.

Figure 7A:
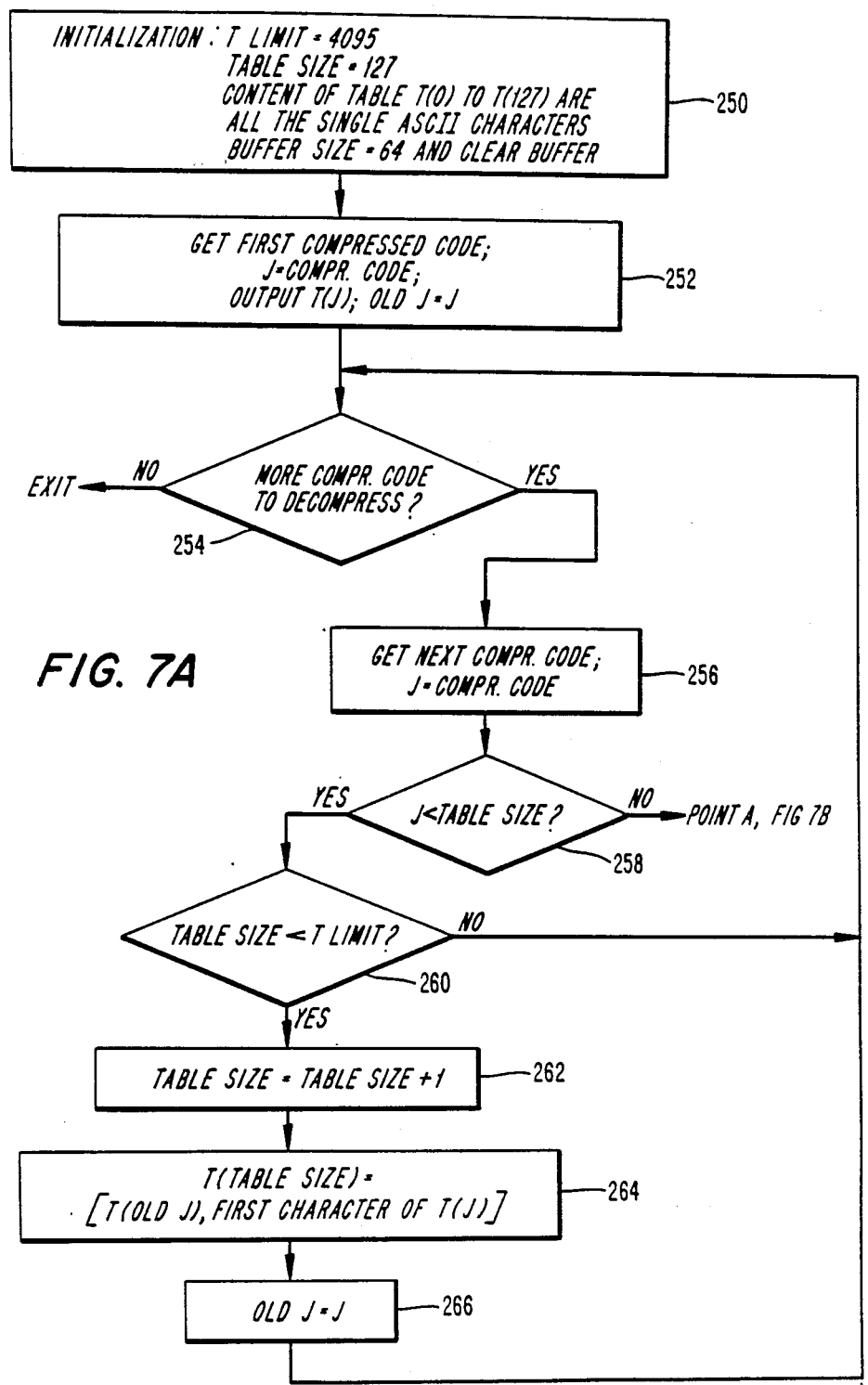
FIGS. 7A and 7B are logic flow charts of a table construction used in the procedure of FIG. 6.
Figure 7B:
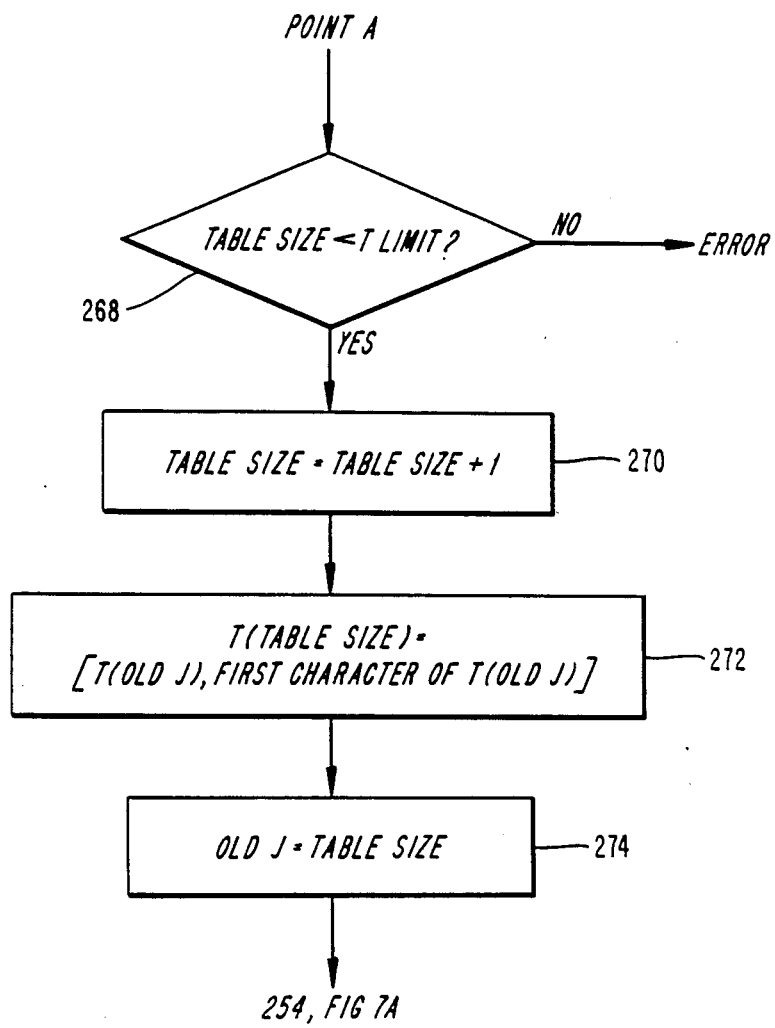

Referring now to FIGS. 7A and 7B, there is shown a table construction procedure for use with the data decompression procedure of FIG. 6. Initialization is provided at block 250 in which a table size limit of 4095 entries is established. An initial table size of 127 entries is established, and the initial entries filled with a predetermined set of data symbol characters, such as, for example, single ASCII characters. A buffer size of sixty-four characters is established and the buffer is cleared.

At block 252, a first code value signal is received, and a current table index J is set equal to the code value signal. An old table index is set equal to the current table index. If more code value signals are available for decompression, as determined at block 254, the next code value signal is acquired at block 256 and the current index set equal to that code signal value. At block 258, it is determined if the current index is less than the table size. If so, and if the table size is less than the table limit (inidicating that the table is not yet full) as determined at block 260, the table size is incremented at block 262 and a new table entry added to the bottom of the table at block 264. The new table value entry consists of the first character of the current table value index concatenated to the table entry specified by the old index.

At block 266, the old index is set equal to the current index and program flow returns to block 264.

If the curent index is not less than the table size as determined at block 258, a determination is made at block 68 (FIG. 7B) if the table size is less than the table limit, a negative determination constituting an error condition. If a positive determination is made by block 268, the table size is incremented at block 270 and a new table entry added at the bottom of the table at block 272. The new table entry consists of the first character of the table entries specified by the old index concatenated to the entire table entry specified by the old index. At block 274, the old index is set equal to the table size and procedure flow returns to block 254 of FIG. 7A.

The performance of the data compression procedure can be expressed by a quantity known as the compression ratio:

$$\text{Compression ratio} = \frac{\text{Total number of bits in the uncompressed original data file}}{\text{Total number of bits in the compressed file}}$$

For the ASCII files, the compression ratio can be expressed as $$\text{Compression ratio} = \frac{[\text{Total number of ASCII symbols in the file}]*7}{[\text{Tot. nbr. of compressed codes}]*[\text{Number bits per code}]}$$

where the number of bits in each ASCII symbol is assumed to be 7. If the number of bits per ASCII file is assumed to be 8, the compression ratio will be correspondingly increased by a factor of 8/7. As is well known by those skilled in the art, ASCII characters are either seven or eight bits in length, according to whether a parity bit is included.

Figure 8:
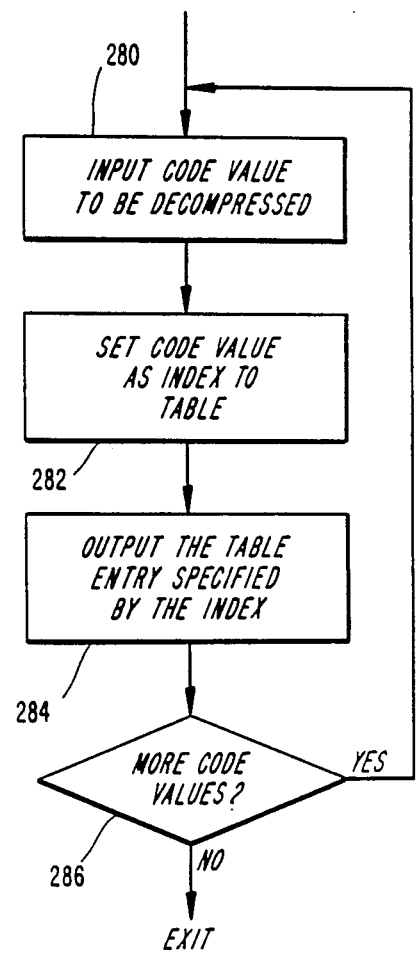
FIG. 8 is a logic flow chart of a decompression table look-up procedure used in the procedure of FIG. 6.

FIG. 8 shows a decompression table lookup procedure which may be used with the procedure described with respect to FIGS. 7A and 7B. At block 280, a code value signal to be decompressed is acquired. An index to the data translation table is set equal to the acquired code value signal, as indicated at block 282. At block 284, data symbol signals contained in the table entries specified by the index are provided as decompressed data output. If more code values are to be decompressed, as determined at block 286, procedure flow returns to block 280. Otherwise, the procedure exits.

Figure 9:
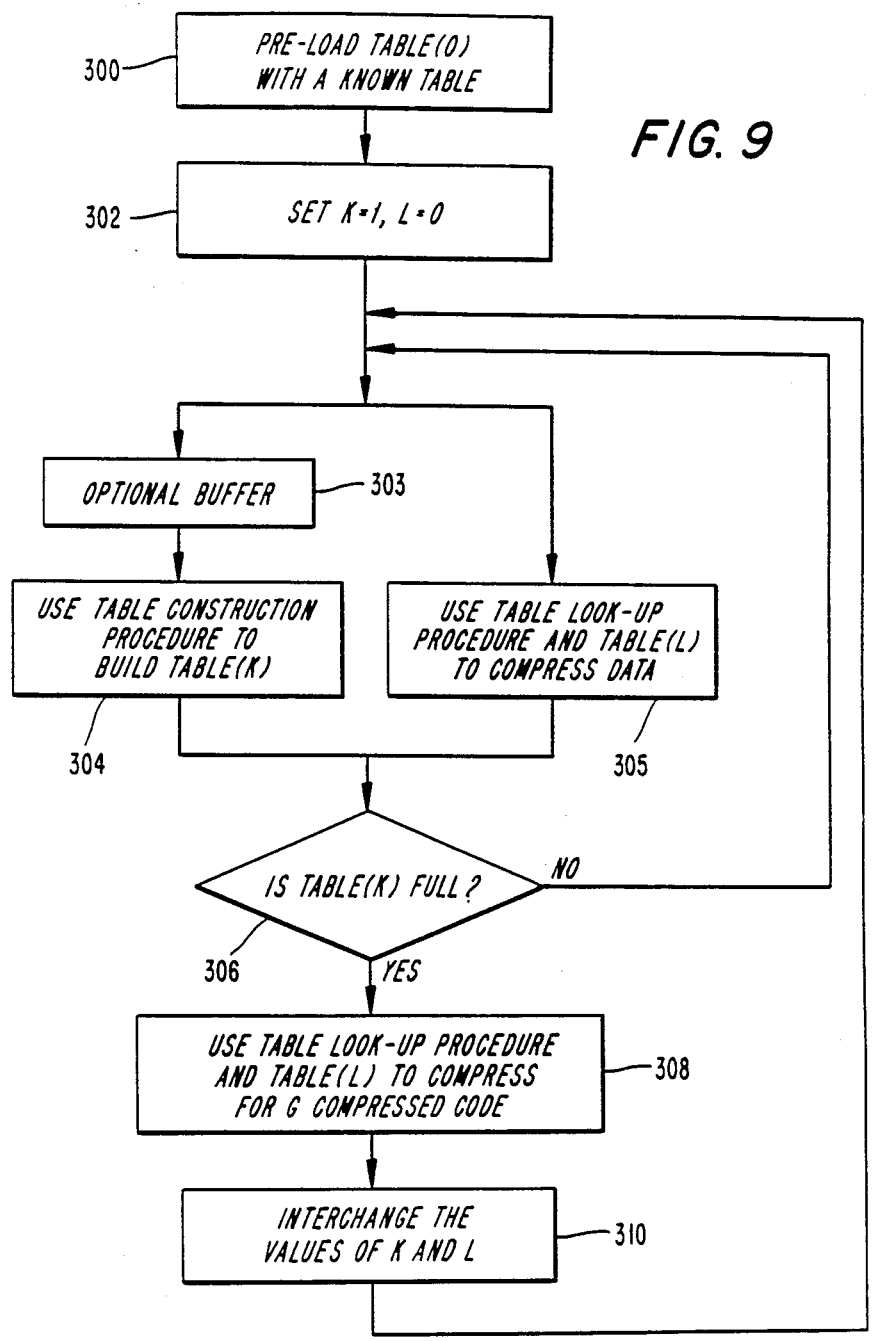
FIG. 9 is a logic flow chart of a data compression procedure which constitutes another preferred embodiment of the invention.

Referring now to FIG. 9, there is shown a logic flow diagram of an alternative embodiment of the present invention. In the alternative embodiment, two translation tables are also used, with one of the tables completely filled initially with a predetermined set of data symbol signals. For large files, the selection of this preloaded translation table has only a second order effect on the data compression performance of the procedure. Initially, table(0) is used to compress data while table(1) is being built. After table(1) has been filled, the role of the two tables are switched. When table(0) is full, the role of the two tables is switched once again. The building and switching process is continued until all data have been compressed.

At block 300, table(0) is preloaded with data symbol signal values constituting a known set of table entries. This known set of table entries could constitute a translation table from the last time the procedure was executed. Alternatively, a standard startup table of average text statistical characteristics could be employed.

At block 302, flags K and L are initialized to 1 and 0, respectively, for use in providing role switching for the two translation tables. At block 304, a table construction procedure, such as the procedure shown in FIG. 4, is used to build table K, using input data symbol signals. Optionally, input data symbols can be stored in a buffer prior to executing the table construction procedure, as indicated at 303, to permit use of slower hardware.

Concurrently, a compression table lookup procedure, such as shown in FIG. 5, is executed at block 305, using data symbol signals stored in table(L). On the initial pass of the procedure of FIG. 9, the compression table lookup procedure is executed using data symbol signals stored in the preloaded table(0).

Blocks 304 and 305 are repeatedly executed until table(K) is full, as determined at block 306. The compression table lookup procedure is then executed using table(L) to produce a "gap" of G code value signals. The values of flags K and L are interchanged at block 310 and procedure flow returns to blocks 304 and 305.

Figure 10:
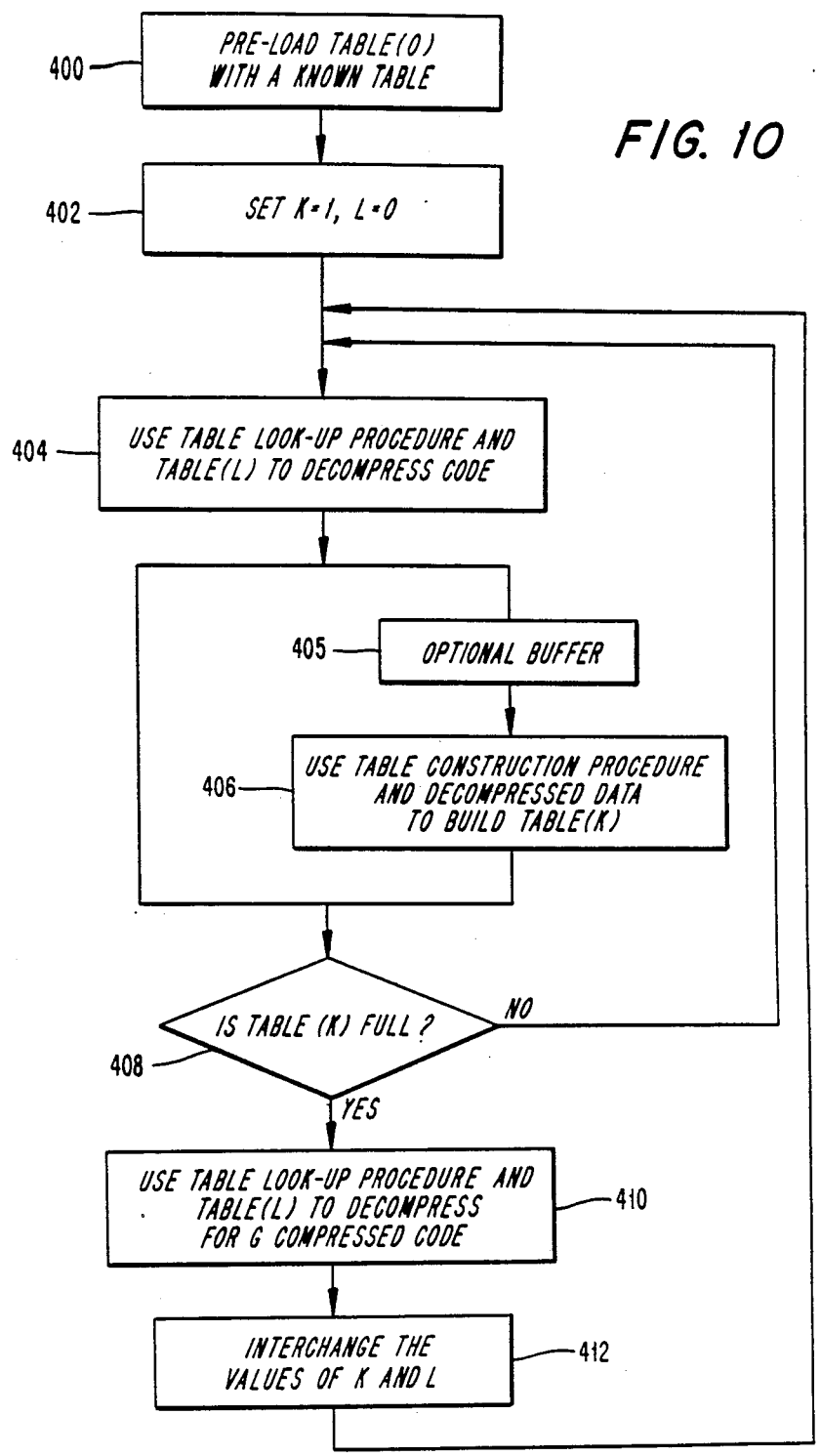
FIG. 10 is a logic flow diagram of a data decompression procedure which constitutes another preferred embodiment of the present invention.

A data decompression procedure which constitutes an alternative embodiment of the invention, and which corresponds to the data compression procedure of FIG. 9 is shown in FIG. 10. The decompression procedure of FIG. 10 makes use of the same table construction procedure used in the data compression procedure of FIG. 3. This considerably simplifies the procedure, compared to the data decompression procedure of FIG. 6, which utilizes the table construction procedure of FIGS. 7A and 7B. Therefore, the procedure of FIG. 10 is significantly less complex. Moreover, the procedure permits the separation of compression and decompression functions, allowing the relatively straightforward table look-up operations of the decompression function to be performed by high-speed hardware, and the more complex compression functions to have their efficiency maximized by slower more elaborate circuitry.

At block 400, the translation table(0) is preloaded with data symbol signals constituting known table entries. In a manner similar to that discussed with respect to FIG. 9, such known table entries may consist of the table entries constructed during the previous execution of the procedure of FIG. 10 or may consist of standard prestored table entries reflecting average text characteristics.

At block 402, flags K and L are initialized to 1 and 0 respectively, to enable role switching for the two translation tables. At block 404, a decompression table lookup procedure, such as the procedure of FIG. 8, is executed using data symbol signals stored in table L. On the initial pass of the procedure of FIG. 10, the table lookup procedure is executed using the preloaded table entries of table(0).

At block 406, the table construction procedure shown in FIG. 4 is executed, using decompressed data provided in block 404, to build table K. On the inital pass of the procedure of FIG. 10, block 406 builds table(1). Optionally, decompressed data from step 404 can be stored in a buffer, as indicated at block 405, to permit slower hardware to be used to execute the table construction procedure of block 406.

When table K is full, as determined at block 408, the decompression table lookup procedure is executed using data symbols stored in the table L to produce a gap of G decompressed data symbol signals. The values of flags K and L are interchanged and procedure flow returned to block 404.

An ASCII file of 294,720 characters was used to compare the performance of the invention with prior art procedures. An LZW procedure was simulated and gave the following compression ratios:

| Translation Table Size | Log 2 [table size] | Compression ratio |
| --- | --- | --- |
| 1024 | 10 | 1.801530 |
| 2048 | 11 | 1.930491 |
| 4096 | 12 | 2.040739 |

The performance of the two embodiments of the invention in simulating the compression of the same 294,720 character file was as follows:

| (1) Table size = 1024, Log 2 [table size] = 10 bits | | | |
| --- | --- | --- | --- |
| Gap between Table switches | # Tables built | Compression Ratio | Improvement over Prior art |
| (first embodiment) | | | |
| 10 compressed codes | 117 | 2.228338 | 23.69% |
| 100 compressed codes | 105 | 2.215197 | 22.96% |
| 1000 compressed codes | 54 | 2.096180 | 16.36% |
| 10000 compressed codes | 10 | 1.838749 | 2.07% |
| (second embodiment) | | | |
| 1 compressed code | 120 | 2.198184 | 22.02% |
| 10 compressed codes | 118 | 2.205870 | 22.44% |
| 100 compressed codes | 106 | 2.190040 | 21.57% |
| 1000 compressed codes | 54 | 2.070286 | 14.92% |
| 10000 compressed codes | 11 | 1.697151 | −22.02% |

| (2) Table size = 2048, Log 2 [table size] = 11 bits | | | |
| --- | --- | --- | --- |
| Gap between Table switches | # Tables built | Compression Ratio | Improvement over Prior art |
| (first embodiment) | | | |
| 10 compressed codes | 45 | 2.470775 | 27.99% |
| 100 compressed codes | 43 | 2.466032 | 27.74% |
| 1000 compressed codes | 28 | 2.355973 | 22.04% |
| 10000 compressed codes | 7 | 2.024210 | 4.85% |
| (second embodiment) | | | |
| 1 compressed code | 46 | 2.347034 | 21.58% |

| (3) Table size = 4096, Log 2 [table size] = 12 bits | | | |
| --- | --- | --- | --- |
| Gap between Table switches | # Tables built | Compression Ratio | Improvement over Prior art |
| (first embodiment) | | | |
| 10 compressed codes | 18 | 2.658337 | 30.02% |
| 100 compressed codes | 17 | 2.617938 | 28.28% |
| 1000 compressed codes | 14 | 2.476805 | 21.37% |
| 10000 compressed codes | 5 | 2.328530 | 14.10% |
| (second embodiment) | | | |
| 1 compressed code | 19 | 2.279320 | 11.69% |

The above simulations indicate that the gap between table switches impacts the performance of the procedure of the second embodiment, in that the gap should be as small as possible. The more tables built, the better is the performance.

In simulating the performance of the procedure of the second embodiment, a pre-loaded table consisting of 128 non-empty entries corresponding to the 128 ASCII character symbols was employed, with the remaining entries being left empty. The table thus did not represent the statistical characteristics of the text, and resulted in an initial penalty on the performance of data compression. An initial table more characteristic of the text being compressed would, of course, improve the result.

Figure 11:
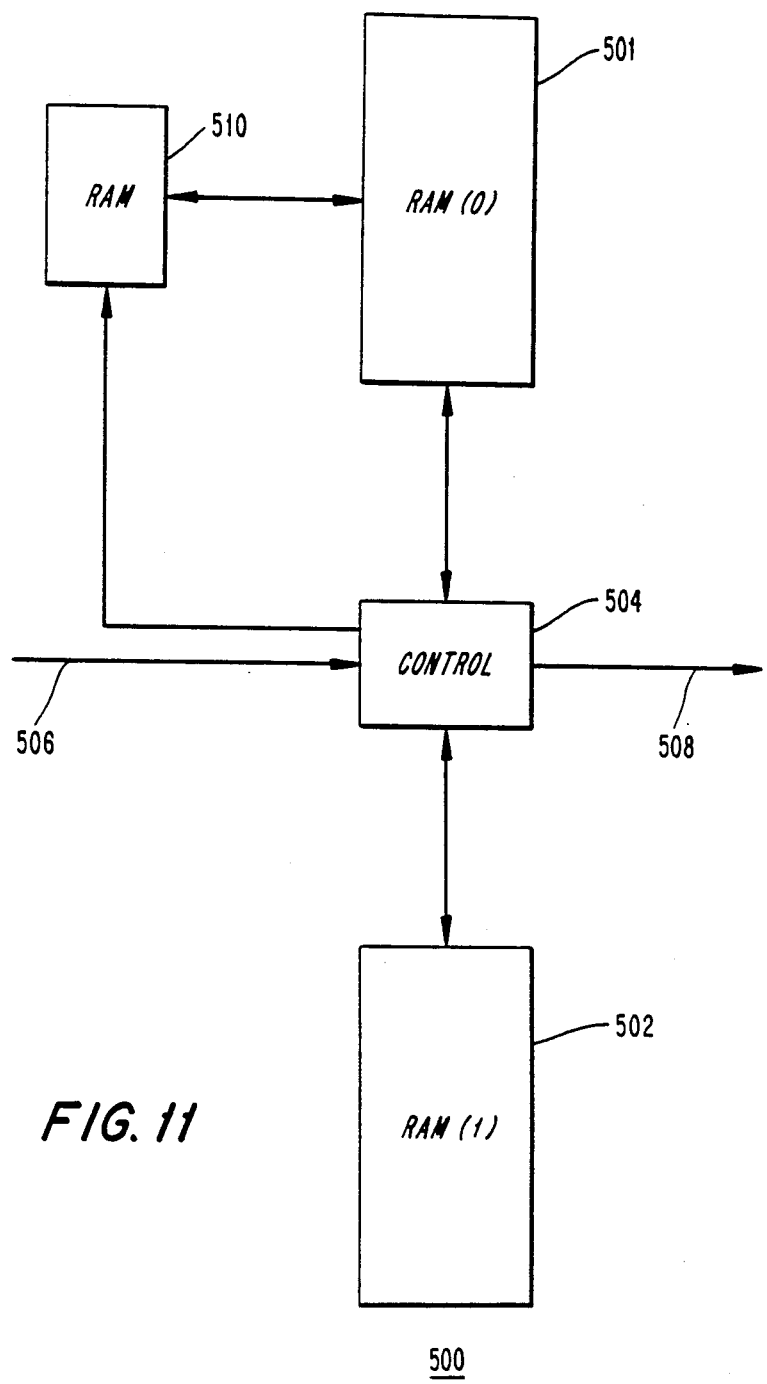
FIG. 11 is a block diagram of data compression apparatus which may be used to execute the procedure shown in FIG. 3.

FIG. 11 is a block diagram of apparatus 500 which may be used to execute the procedure of FIG. 3. The invention as embodied in FIG. 11 includes first memory means for storing a plurality of data symbol signals as strings in a first translation table, with each of the strings being associated with a code value signal. As embodied herein, the first memory means comprises a random access memory (RAM) 501, designated RAM(0) in FIG. 11. RAM 501 contains a first translation table, such as table 22 of FIG. 1.

The invention further includes second memory means for storing a plurality of input data symbol signals as strings in a second translation table, with each of the strings being associated with a code value signal. As embodied herein, the second memory means comprises a RAM 502, designated RAM(1) in FIG. 11.

The invention further comprises control means for initially loading the first table with data symbol signals, and for alternatingly generating a stream of the code value signals representative of input data symbol signals according to a predetermined data compression procedure using the contents of the first table while loading the second table with the input data symbol signals according to the predetermined table construction procedure until the second table is full and generating a stream of the code value signals representative of input data symbol signals according to the predetermined data compression procedure using the contents of the second table while loading the first table with the input data symbol signals until the first table is full. As embodied herein, the control means comprises a control circuit 504, such as a state machine, connected to RAMs 501 and 502. An input terminal 506 supplies control circuit 504 with a stream of input data symbol signals to be compressed. Using the procedure shown in FIG. 3 and described above, control circuit 504 processes input data symbol signals supplied through input terminal 506 and generates a stream of code value signals which are supplied to an output terminal 508.

Preferably, the control means comprises means for initially loading the first table with input data symbol signals according to the predetermined table construction procedure. Control circuit 504 may execute the table construction procedure shown in FIG. 4 to initially load first table in RAM 501 with input data symbol signals. In the preferred embodiment, the apparatus also includes a memory circuit 510 for storing a plurality of data symbol signals, such as ASCII characters. Memory 510 may be a RAM, as shown in FIG. 11. Alternatively, memory 510 may constitute a read-only memory containing the desired data symbol characters.

Preferably, the control means comprises means for generating, after initially loading the first translation table input data symbol signals, a first predetermined number of the code value signals from the first table according to the predetermined data compression procedure. As embodied herein, control circuit 504 uses a table lookup procedure shown in FIG. 5 to compress data symbol signals as indicated at block 166 of FIG. 3.

Figure 12:
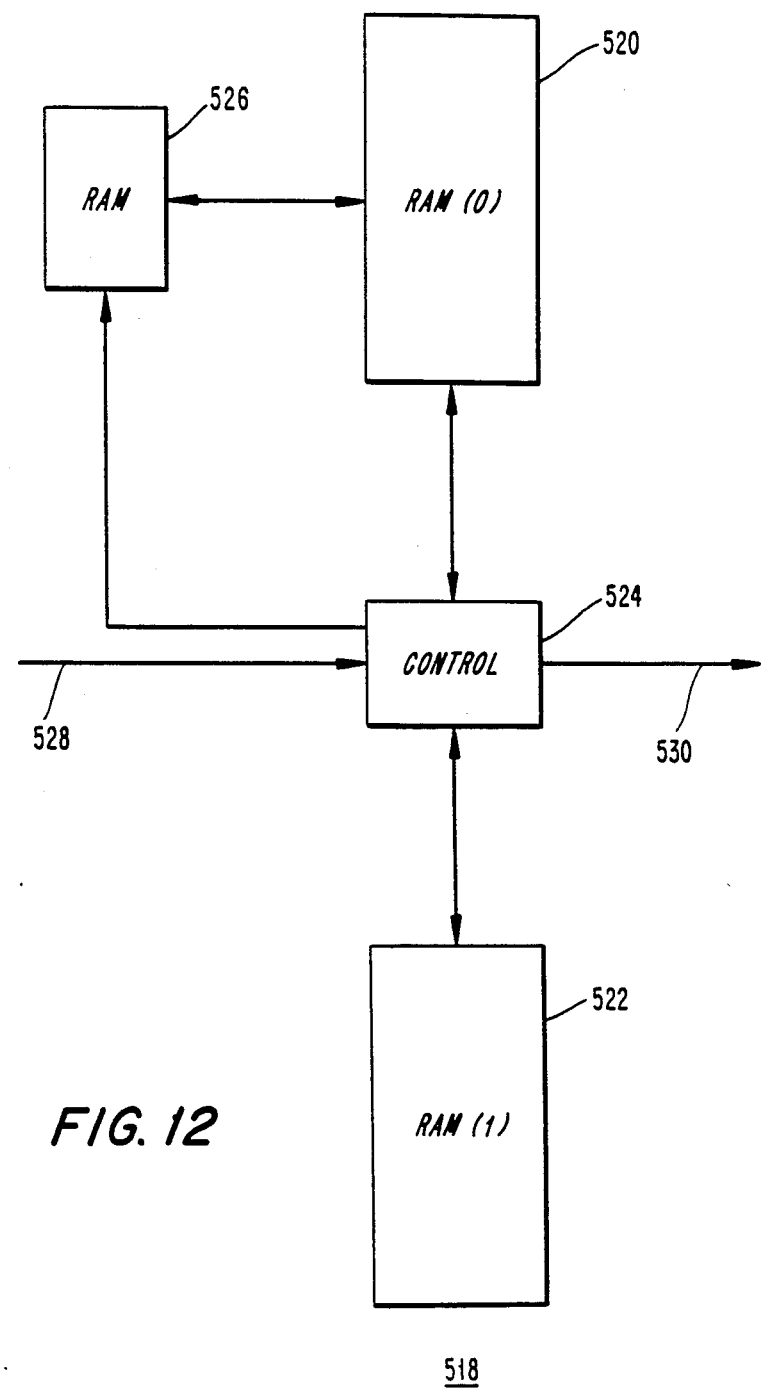
FIG. 12 is a block diagram of data decompression apparatus which may be used to execute the procedure of FIG. 6.

Referring now to FIG. 12, there is shown data decompression apparatus 518 which may be used to execute the data decompression procedure shown in FIG. 6. The invention includes first memory means for storing a plurality of data symbol signals as strings in a first translation table, with each of the strings being associated with a code value signal. As embodied herein, the first memory means comprises RAM 520, designated RAM(0) in FIG. 12.

The invention also comprises second memory means for storing a plurality of input data symbol signals as strings in the second translation table, with each of the strings being associated with a code value signal. As embodied herein, the second memory means comprises a RAM 522, designated RAM(1) in FIG. 12.

The invention further comprises control means for initially loading the first table with data symbol signals using input code values according to a predetermined decompression table construction procedure, and for alternatingly processing the code value signals using the first table according to a predetermined decompression procedure to generate a stream of data symbol signals while loading data symbol signals in the second translation table according to a predetermined table consruction procedure and processing the code value signals using the second table according to the predetermined decompression procedure to generate a stream of data symbol signals while loading the first table with data symbol signals according to the predetermined table construction procedure. As embodied herein, the control means comprises a control circuit 524, which may be implemented as a state machine connected to RAMs 520 and 522 to execute the procedure of FIG. 6. Input code value signals are supplied to an input terminal 528 and decompressed data symbol signals are provided at an output terminal 530.

Apparatus 518 also includes a RAM 526. RAM 526 is used to store data symbol signals for use in initializing RAMs 520 and 522 with data symbol signals constituting ASCII text characters.

Figure 13:
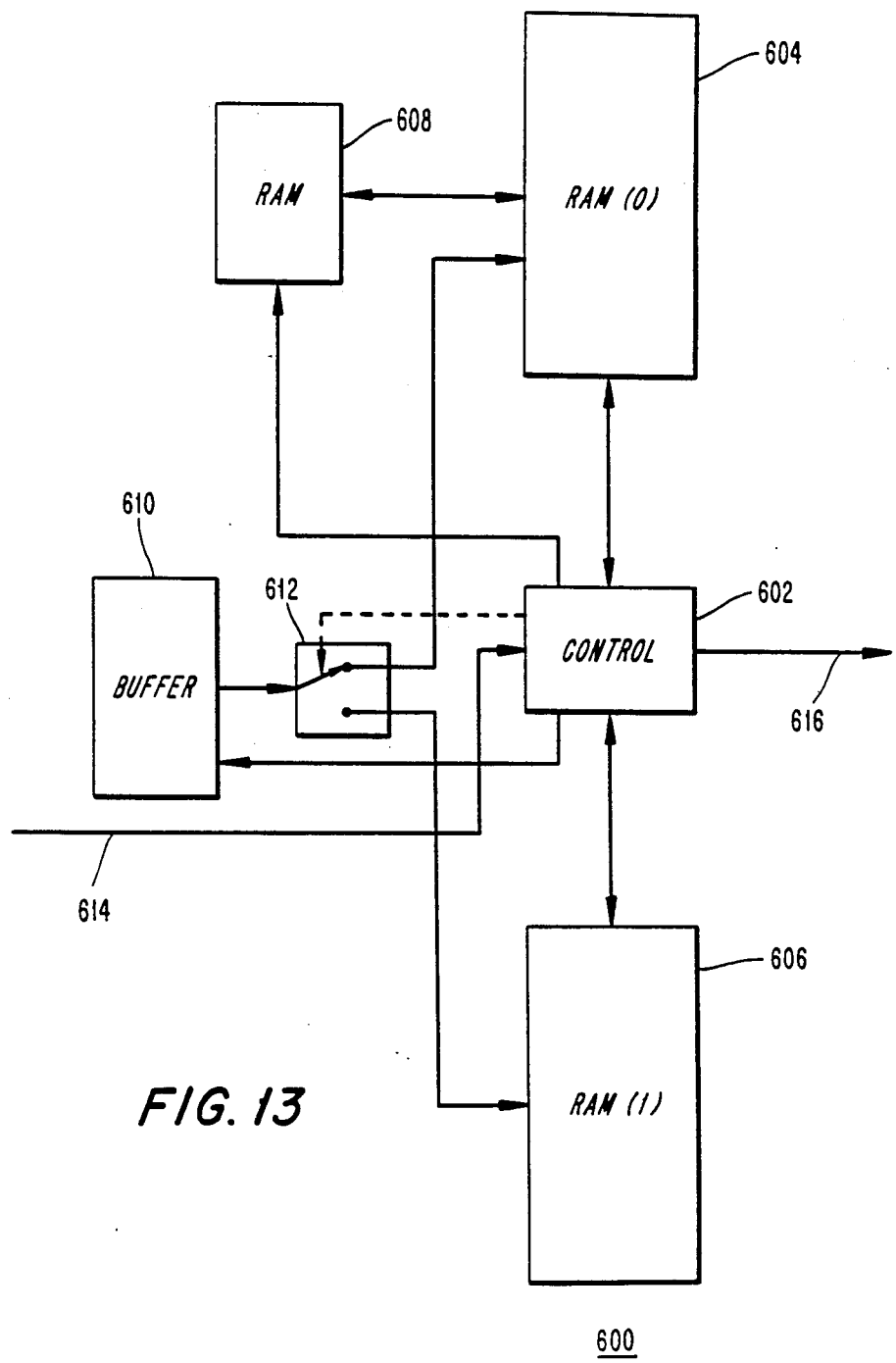
FIG. 13 is a block diagram of data compression apparatus which may be used to execute the procedure of FIG. 9.

FIG. 13 shows data compression apparatus 600 similar to apparatus 500 shown in FIG. 11 but which contains a control circuit 602 which executes the data compression procedure shown in FIG. 9. Control circuit 602 is connected to a pair of RAMs 604 and 606 which respectively contain first and second translation tables. Appartus 600 also cotnains a RAM 608 which contains a complete preloaded translation table. This preloaded translation table may represent a translation table generated by the apparatus of FIG. 13 during a previous execution of the data compression procedure of FIG. 9. The preloaded translation table may also constitute a standard translation table representing average text statistical characteristics. Such a translation table may be stored in a read-only memory performing the function of memory 608.

Apparatus 600 also contains a buffer circuit 610 and a multiplexer 612. Data symbol signals generated by control circuit 602 are stored in buffer circuit 610 and supplied, under control of control circuit 602 to either the data translation table stored in RAM 604 or the data translation table stored in RAM 606. It is to be emphasized that buffer 610 and multiplexer 612 are not required, but permit the separation of compression and decompression functions.

Apparatus 600 also includes input and output terminals 614 and 616, respectively.

Figure 14:
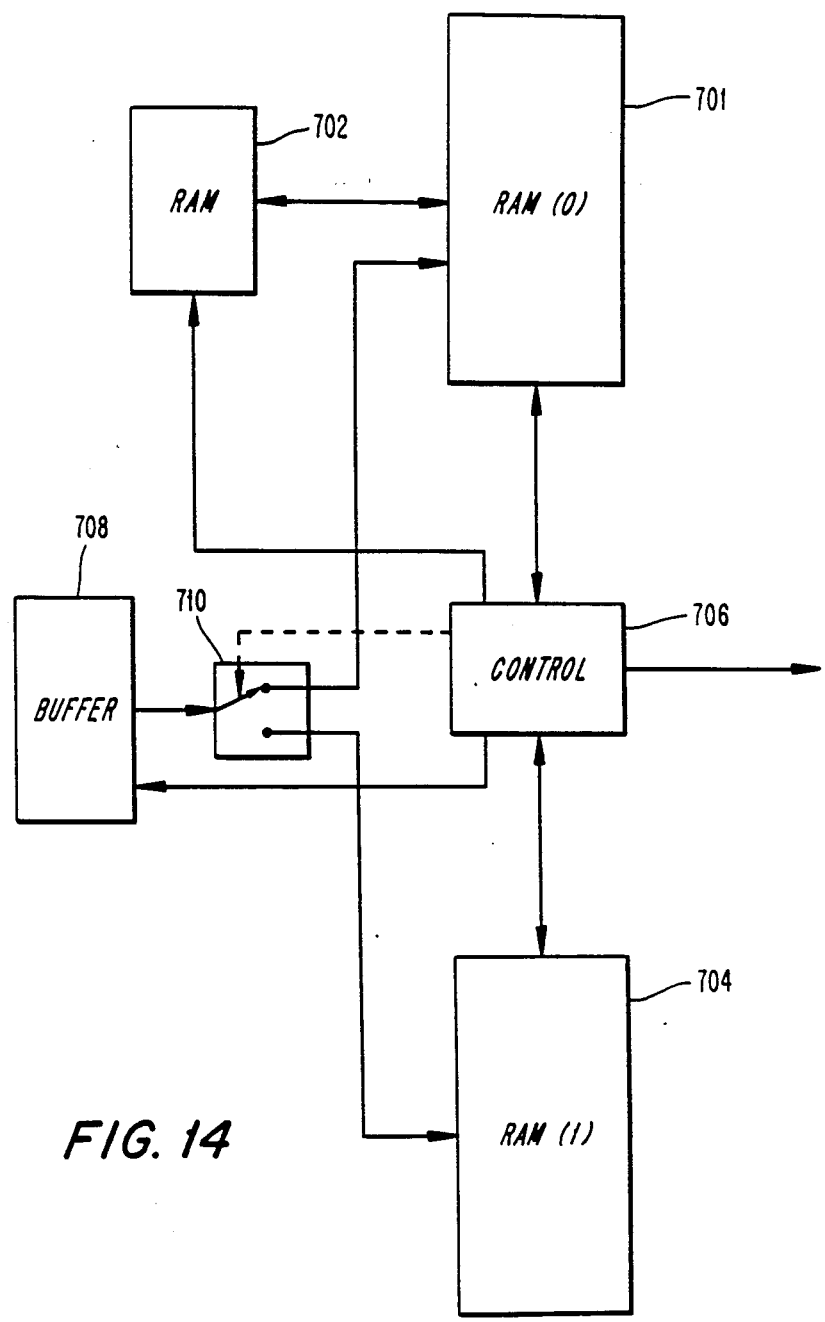
FIG. 14 is a block diagram of data compression apparatus which may be used to execute the procedure of FIG. 10.

Referring now to FIG. 14, there is shown a data decompression apparatus 700 for generating an output stream of decompressed data symbol signals from an input stream of code value signals representing compressed data symbol signals, which constitutes another embodiment of the invention. The invention includes first memory means for storing a plurality of data symbol signals as strings in the first translation table, with each of the strings being associated with a code value signal and the table containing preloaded data symbol signals. As embodied herein, the first memory means comprises a RAM 701, designated RAM(0) in FIG. 14, and a RAM 702.

The invention further includes second memory means for storing a plurality of input data symbol signals as strings in a second translation table, with each of the strings being associated with a code value signal. As embodied herein, a second memory means comprisse a RAM 704, designated RAM(1) in FIG. 14. The invention further includes control means for generating a stream of data symbol signals using preloaded data symbol signals in the first table, and for alternatingly processing the code value signals using the first table according to a predetermined decompression procedure to generate a stream of data symbol signals while loading data symbol signals in the second translation table according to a predetermined table construction procedure using the generated data symbol signals and processing the code value signals using the second table according to the predetermined decompression procedure to generate a stream of data symbol signals while loading data symbol signals in the first table according to the predetermined table construction procedure using the generated data symbol signals.

As embodied herein, the control means comprises a control circuit 706 constituting a state machine connected to RAMs 701 and 704. Control circuit 406 executes the data decompression procedure shown in FIG. 10.

RAM 702 contains data symbol signals constituting a complete data translation table as constructed by the apparatus of FIG. 14 during a previous execution of the procedure of FIG. 10. Alternatively, the functions of RAM 702 may be performed by a read-only memory (ROM) containing a standard data translation table representing text of average statistical characteristics.

Preferably, the control means includes means for generating, after altenatingly loading one of the first and second tables, a predetermined number of data symbol signals from input code value signals using the respective alternatingly loaded table according to the predetermined data compression procedure. Such control means are provided by control circuit 406, executing the data decompression procedure shown in FIG. 10, including block 410.

The invention may also include buffer means for storing a plurality of the generated data symbol signals for use in alternatingly loading the tables. As embodied herein, the buffer means comprises a buffer circuit 708 and a multiplexer 710. Data symbol signals generated by control circuit 706 are stored in buffer circuit 708 and supplied, under control of control circuit 706, to either the data translation table stored in RAM 700 or the data translation table stored in RAM 704.

It will be apparent to those skilled in the art that various modifications and variations can be made in the apparatus and methods of this invention without departing from the spirit or the scope of the present invention. The present invention covers such modifications and variations which are within the scope of the appended claims and their equivalence.

I claim:

1. A method for compressing input data symbol signals to generate a stream of code value signals constituting a compressed form of the input data symbol signals, the method comprising:
    a first step of loading a first translation table in memory with data symbol signals;
    a second step of loading a second translation table in memory with input data symbol signals according to a predetermined table construction procedure;
    a third step of generating a stream of the code value signals representative of input data symbols according to a predetermined data compression procedure using the contents of the first table;
    a fourth step of loading the first table with the input data symbol signals according to the same predetermined table construction procedure as used in the second step;
    a fifth step of generating a stream of the code value signals representative of input data symbols according to the same predetermined data compression procedure as used in the third step using the contents of the second table; and
    a sixth step of repeatedly performing the second through fifth steps.

2. A method as recited in claim 1 wherein the first step comprises loading the first table with input data symbol signals according to the same predetermined table construction procedure as used in the second and fourth steps.

3. A method as recited in claim 1 wherein the first step comprises loading the first table with a predetermined set of data symbol signals.

4. A method as recited in claim 3 wherein the predetermined set of data symbol signals comprises data symbol signals other than the input data symbol signals.

5. A method as recited in claim 1 wherein the second and third steps are performed concurrently, and the fourth and fifth steps are performed concurrently.

6. A method as recited in claim 1 comprising a first intermediate step, between the first and second steps, of generating a first predetermined number of the code value signals from the first table according to the predetermined data compression procedure and a second intermediate step, between the third and fourth steps, of generating a second predetermined number of code value signals from the first table according to the predetermined data compression procedure.

7. A method as recited in claim 1 comprising a third intermediary step, between the first and second steps, of loading a first buffer with input data symbols.

8. A method as recited in claim 1 wherein the predetermined table construction procedure comprises:
    a first substep of filling a second buffer in memory with input data symbol signals to be compressed;
    a second substep of finding the longest string of data symbol signals in the second buffer which also appear in the table;
    a third substep of incrementing the table size;
    a fourth substep of concatenating the longest string of data symbol signals in the second buffer which also appears in the table with the next data symbol signal following in the second buffer and storing the concatenated string as the next table entry;
    a fifth substep of deleting the concatenated string from the second buffer; and
    a sixth step of repeatedly performing the second through fifth substeps.

9. A method as recited in claim 1 wherein the predetermined data compression procedure comprises:
    a first substep of sequentially searching the translation table for the table entry consisting of the longest consecutive string of input data symbol signals, beginning with the first input data symbol signal;

a second substep of outputting the location in the translation table for the table entry consisting of the longest consecutive string of input symbols as the code value signal of the longest consecutive string;

a third substep of sequentially searching the translation table for the table entry consisting of the longest subsequent consecutive string or input data symbol signals, begining with the symbol after the last symbol in the string found as a result of the first substep;

a fourth substep of outputting the location in the translation table of the table entry consisting of the longest subsequent consecutive string of input symbols as the code of the longest subsequent consecutive string; and a fifth substep of repeatedly performing the third and fourth substeps.

10. A method of generating a stream of data symbol signals from a stream of code value signals representing compressed data symbol signals, the method comprising:

a first step of loading data symbol signals in a first translation table in memory;

a second step of processing the code value signals using the first table according to a predetermined decompression procedure to generate a stream of data symbol signals;

a third step of loading data symbol signals in a second translation table in memory according to a predetermined table construction procedure;

a fourth step of processing the code value signals using the second table according to the same predetermined decompression procedure as used in the second step to generate a stream of data symbol signals;

a fifth step of loading the first table with data symbol signals according to the same predetermined table construction procedure as used in the third step; and a sixth step of sequentially repeating the second through fifth steps.

11. A method as recited in claim 10 comprising a first intermediate step, between the first and second steps, of generating a first predetermined number of the code value signals from the first table according to the predetermined decompression procedure and a second intermediate step, between the third and fourth steps, of generating a second predetermined number of code value signals from the first table according to the predetermined decompression procedure.

12. A method as recited in claim 10 wherein the second and third steps are performed concurrently, and the fourth and fifth steps are performed concurrently.

13. A method as recited in claim 10 wherein the predetermined table construction procedure comprises:

a first substep of establishing a table size, inputting a first code value signal, setting a current index equal to the first code value signal, and setting an old index equal to the current index;

a second substep of terminating the procedure if there are no more code value signals to process;

a third substep of inputting the next code value signal and setting the current index equal to the next code value signal;

a fourth substep, performed if the current index is less than the table size, of incrementing the table size, adding a new entry to the end of the table which is equal to the first data symbol signal of the current index table entry concatenated to the old index table entry, and setting the old index equal to the current index;

a fifth substep, performed if the current index is not less than the table size, of incrementing the table size, adding a new entry to the end of the table which is equal to the first data symbol signal of the old index table entry concentrated to the old index table entry, and setting the old index equal to the table size; and a sixth substep of repeatedly performing the second through fifth substeps.

14. A method as recited in claim 10 wherein the predetermined decompression procedure comprises:

a first substep of inputting a code value signal to be decompressed;

a second substep of setting the code value signal as an index to a translation table; and a third substep of outputting the table entry specified by the index.

15. A method as recited in claim 10, wherein the first step comprises the step of loading data symbol signals in the first translation table using the predetermined table construction procedure.

16. A method of generating an output stream of decompressed data symbol signals from an input stream of code value signals representing compressed data symbol signals, the method comprising:

a first step of preloading a first translation table in memory with a predetermined set of data symbol signals;

a second step of processing the code value signals using the data symbols stored in the first table according to a predetermined decompression procedure to obtain a stream of decompressed data symbol signals;

a third step of loading a second translation table in memory with the decompressed data symbol signals obtained in the second step according to a predetermined table construction procedure;

a fourth step of repeatedly performing the second and third steps until the second table is full;

a fifth step of processing the code value signals using data symbol signals stored in the second table according to the same predetermined decompresssion procedure as used in the second step to supply decompresssed data symbol signals to the output stream;

a sixth step of loading the first table with the decompressed data symbol signals obtained in the fifth step according to the same predetermined table construction procedure as used in the third step;

a seventh step of repeatedly performing the fifth and sixth steps until the first table is full; and an eighth step of repeatedly performing the second through seventh steps.

17. A method as recited in claim 16 comprising a first intermediate step, between said fourth and fifth step, of processing the code value signals using the data symbol signals stored in the first table according to the predetermined decompression procedure to supply a predetermined number of decompressed data symbol signals to the output stream.

18. A method as recited in claim 16 wherein the predetermined table construction procedure comprises:

a first substep of filling a buffer in memory with input data symbol signals to be compressed;

a second substep of finding the longest string of data symbol signals in the buffer which also appear in the table;

a third substep of incrementing the longest string of data symbol signals in the buffer which also appears in the table with the next data symbol signal following in the buffer and storing the concatenated string as the next table entry;

a fifth substep of deleting the concatenated string from the buffer; and a sixth substep of repeatedly executing the second through fifth substeps.

19. Apparatus for compressing input data symbol signals to generate a stream of code value signals consisting of a compressed form of the input data symbol signals, the apparatus comprising:

first memory means for storing a plurality of data symbol signals as strings in a first translation table, each of the strings being associated with a code value signal;

second memory means for storing a plurality of input data symbol signals as strings in a second translation table, each of the strings being associated with a code value signal;

control means for initially loading the first table with data symbol signals, and for alternatingly generating a stream of the code value signals representive of input data symbol signals according to a predetermined data compression procedure using the contents of the first table while loading the second table with the input data symbol signals according to a predetermined table construction procedure until the second table is full and generating a stream of the code value sigals representive of input data symbol signals according to the same predetermined data compression procedure as used in generating the code value stream using the contents of the second table while loading the first table with the input data symbol signals according to the same predetermined table construction procedure as used in loading the second table until the first table is full.

20. An apparatus as recited in claim 19 wherein the control means comprises means for initially loading the first table with input data symbol signals according to the same predetermined table construction procedure as used in loading the second table.

21. An apparatus as recited in claim 19 wherein the control means comprises means for initially loading the first table with a predetermined set of data symbol signals.

22. An apparatus as recited in claim 21 wherein the control means comprises means for loading the first table with a predetermined set of data symbol signals other than the input data symbol signals.

23. An apparatus as recited in claim 19 wherein the control means comprises means for generating, after initially loading the first translation table intput data symbol signals, a first predetermined number of the code value signals from the first table according to the predetermined data compression procedure.

24. An apparatus as recited in claim 23 wherein the control means comprises means for generating, after alternatingly loading one of the first and second tables, a second predetermined number of code value signals from the respective alternatingly loaded table according to the predetermined data compression procedure.

25. Apparatus for generating a stream of data symbol signals from a stream of input code value signals representing compressed data symbol signals, the apparatus comprising:

first memory means for storing a plurality of data symbol signals as strings in a first translation table, each of the strings being associated with a code value signal;

second memory means for storing a plurality of input data symbol signals as strings in a second translation table, each of the strings being associated with a code value signal; and control means for initially loading the first table with data symbol signals using input code values according to a predetermined decompression table construction procedure, and for alternatingly processing the code value signals using the first table according to a predetermined decompression procedure to generate a stream of data symbol signals while loading data symbol signals in the second translation table according to a predetermined table construction procedure and processing the code value signals using the second table according to the same predetermined decompression procedure as used in processing the code value signals from the first table to generate a stream of data symbol signals while loading the first table with data symbol signals according to the same predetermined table construction procedure as used in loading the first table.

26. Apparatus for generating an output stream of decompressed data symbol signals from an input stream of code value signals representing compressed data symbol signals, the apparatus comprising:

first memory means for storing a plurality of data symbol signals as strings in a first translation table, each of the strings being associated with a code value signal, the table containing preloaded data symbol signals;

second memory means for storing a plurality of input data symbol signals as strings in a second translation table, each of the strings being associated with a code value signal; and control means for generating a stream of data symbol signals according to a predetermined table decompresssion procedure using preloaded data symbol signals in the first table, and for alternatingly processing the code value signals using the first table according to the same predetermined decompression procedure to generate a stream of data symbol signals while loading data symbol signals in the second translation table according to a predetermined table construction procedure using the generated data symbol signals and processing the code value signals using the second table according to the same predetermined decompression procedure to generate a stream of data symbol signals while loading data symbol signals in the first table according to the same predetermined table construction procedure using the generated data symbol signals.

27. Apparatus as recited in claim 26 wherein the control means comprises means for generating, after alternatingly loading one of the first and second tables, a predetermined number of data symbol signals from input code value signals using the respective alternatingly loaded table according to the predetermined data compression procedure.

28. Apparatus as recited in claim 26 comprising buffer means for storing a plurality of the generated data symbol signals for use in alternatingly loading the tables.

* * * * *

UNITED STATES PATENT AND TRADEMARK OFFICE
CERTIFICATE OF CORRECTION

PATENT NO. : 4,881,075

DATED : November 14, 1989

INVENTOR(S) : Lih-Jyh Weng

It is certified that error appears in the above-identified patent and that said Letters Patent is hereby corrected as shown below:

Claim 9, column 15, line 7, change "or" to --of--.

Claim 13, column 16, line 8, change "concentrated" to --concatenated--.

Claim 18, column 17, line 4, "incrementing" should be followed by --the table size; a fourth substep of concatenating--.

Claim 19, column 17, line 27, change "representive" to --representative--.

UNITED STATES PATENT AND TRADEMARK OFFICE
CERTIFICATE OF CORRECTION

PATENT NO. : 4,881,075

DATED : November 14, 1989

INVENTOR(S) : Lih-Jyh Weng

It is certified that error appears in the above-identified patent and that said Letters Patent is hereby corrected as shown below:

Claim 19, column 17, line 34, change "sigals" to --signals--.

Signed and Sealed this

Sixth Day of August, 1991

*Attest:*

*Attesting Officer*

HARRY F. MANBECK, JR.

*Commissioner of Patents and Trademarks*